(12) United States Patent
Kim et al.

(10) Patent No.: US 11,659,281 B2
(45) Date of Patent: May 23, 2023

(54) BLUR COMPENSATION CIRCUIT FOR OPTICAL IMAGE STABILIZATION DEVICE

(71) Applicant: LX Semicon Co., Ltd., Daejeon (KR)

(72) Inventors: Kyu Ho Kim, Daejeon (KR); Jin Kook Yun, Daejeon (KR); Dong Gil Jeong, Daejeon (KR); Ho Jeong Jin, Daejeon (KR)

(73) Assignee: LX SEMICON CO., LTD., Daejeon (KR)

( * ) Notice: Subject to any disclaimer, the term of this patent is extended or adjusted under 35 U.S.C. 154(b) by 0 days.

(21) Appl. No.: 17/456,517

(22) Filed: Nov. 24, 2021

(65) Prior Publication Data

US 2022/0166926 A1 May 26, 2022

(30) Foreign Application Priority Data

Nov. 25, 2020 (KR) .................... 10-2020-0159517

(51) Int. Cl.
*H04N 23/68* (2023.01)
*H03M 3/00* (2006.01)

(52) U.S. Cl.
CPC ............ *H04N 23/687* (2023.01); *H03M 3/30* (2013.01); *H04N 23/6812* (2023.01)

(58) Field of Classification Search
CPC .... H04N 5/23248–23287; G02B 27/64; G02B 27/646; G03B 2205/00–0084; H03M 3/30–51
See application file for complete search history.

(56) References Cited

U.S. PATENT DOCUMENTS

| | | | |
|---|---|---|---|
| 2012/0026348 A1* | 2/2012 | Yun ..................... | H04N 5/23258 348/208.4 |
| 2012/0293674 A1* | 11/2012 | Uenaka .............. | H04N 5/23258 348/208.99 |
| 2014/0071545 A1* | 3/2014 | Sumioka ............ | H04N 5/23287 359/813 |
| 2017/0214853 A1 | 7/2017 | Koyano | |
| 2020/0374428 A1* | 11/2020 | Saito ........................ | G02B 7/28 |

FOREIGN PATENT DOCUMENTS

| KR | 2014-0140773 A | 12/2014 |
|---|---|---|
| KR | 2015-0137788 A | 12/2015 |
| KR | 2016-0070589 A | 6/2016 |

* cited by examiner

*Primary Examiner* — Paul M Berardesca
(74) *Attorney, Agent, or Firm* — Polsinelli PC

(57) ABSTRACT

A blur compensation circuit of an optical image stabilization device includes a movement detection circuit configured to provide a movement detection signal corresponding to a movement of a photographing module; a position detection circuit configured to provide a position signal of an actuator for driving the photographing module; a delta-sigma conversion circuit configured to generate control data corresponding to a deviation between the movement detection signal and the position signal, perform a delta-sigma conversion on the control data, and output driving data corresponding to a result of the delta-sigma conversion; and a driving circuit configured to control driving of the actuator by the driving data.

20 Claims, 5 Drawing Sheets

BLUR COMPENSATION CIRCUIT FOR OPTICAL IMAGE STABILIZATION DEVICE

BACKGROUND

1. Technical Field

Various embodiments generally relate to an optical image stabilization device, and more particularly, to a blur compensation circuit of an optical image stabilization device which is improved to compensate for blur of an image to be photographed.

2. Related Art

As a representative example of a mobile camera, a smart phone equipped with a photographing module may be exemplified.

The photographing module includes a lens and an image sensor, and may photograph a desired subject as the image sensor senses the image of the subject projected through the lens.

When a user photographs the subject while holding the mobile camera by the hand without using a fixing device such as a tripod, the mobile camera may photograph a blurry image due to the shake of the hand of the user. Also, when the mobile camera photographs the subject with a long exposure time in a dark environment, the mobile camera may photograph a blurry image due to fine shake.

The mobile camera needs to compensate for blur caused by the above reasons. In order to compensate for the blur, an optical image stabilization (hereinafter, referred to as "OIS") function may be provided to the mobile camera.

The OIS function may be performed in such a way to control an image path through which the image of the subject is transferred to the image sensor through the lens.

In more detail, the OIS function may be implemented in such a way to sense the movement of the photographing module by using a movement sensor such as a gyroscope, calculate how the photographing module moves and control the image path to offset the movement of the photographing module as a result of the calculation.

In order to control the image path by the OIS function, the driving of an actuator should be controlled, and the control may be implemented using a constant current scheme, a constant voltage scheme or a PWM (pulse width modulation) scheme.

However, when a circuit for controlling the driving of the actuator is designed in the constant current scheme or the constant voltage scheme, problems may be caused in that the configuration of the circuit is complicated as a DAC and so forth for controlling the driving at a high resolution are included and the area of a chip in which the circuit is implemented increases.

Further, when a circuit for controlling the driving of the actuator is designed in the PWM scheme, problems may be caused in that the circuit requires a high frequency of a clock to achieve a high resolution and as a result, EMI performance deteriorates due to the switching of logics.

Therefore, there is a need to develop a circuit capable of implementing the OIS function while solving the above problems.

SUMMARY

Various embodiments are directed to a blur compensation circuit of an optical image stabilization device capable of being implemented to have a high resolution while being configured by a simple circuit.

Also, various embodiments are directed to a blur compensation circuit of an optical image stabilization device capable of being configured by a simple circuit and thereby reducing a chip area in which the circuit is implemented.

Further, various embodiments are directed to a blur compensation circuit of an optical image stabilization device capable of reducing switching noise and thereby improving EMI performance.

In an embodiment, a blur compensation circuit of an optical image stabilization device may include: a movement detection circuit configured to provide a movement detection signal corresponding to a movement of a photographing module; a position detection circuit configured to provide a position signal of an actuator for driving the photographing module; a delta-sigma conversion circuit configured to generate control data corresponding to a deviation between the movement detection signal and the position signal, perform a delta-sigma conversion on the control data, and output driving data corresponding to a result of the delta-sigma conversion; and a driving circuit configured to control driving of the actuator by the driving data.

In an embodiment, a blur compensation circuit of an optical image stabilization device may include: a delta-sigma conversion circuit configured to output driving data corresponding to a deviation between a movement detection signal corresponding to a movement of a photographing module and a position signal of an actuator which drives the photographing module, wherein the delta-sigma conversion circuit generates control data corresponding to the deviation between the movement detection signal and the position signal, performs a delta-sigma conversion on the control data, and outputs the driving data corresponding to a result of the delta-sigma conversion.

According to the embodiments of the present disclosure, by using a simple circuit performing delta-sigma conversion, advantages may be provided in that it is possible to compensate for blur by the shake of the hand of a user who uses a mobile camera and photograph an image at a high resolution.

Also, according to the embodiments of the present disclosure, advantages may be provided in that a blur compensation circuit may be configured by a simple circuit performing delta-sigma conversion and thereby it is possible to reduce a chip area in which the blur compensation circuit is implemented.

Further, according to the embodiments of the present disclosure, advantages may be provided in that, since blur compensation is performed by delta-sigma conversion, switching noise accompanying blur compensation may be reduced and as a result, EMI performance may be improved.

DETAILED DESCRIPTION

The present disclosure discloses a blur compensation circuit of an optical image stabilization device (hereinafter referred to as an "OIS device").

Figure 1:
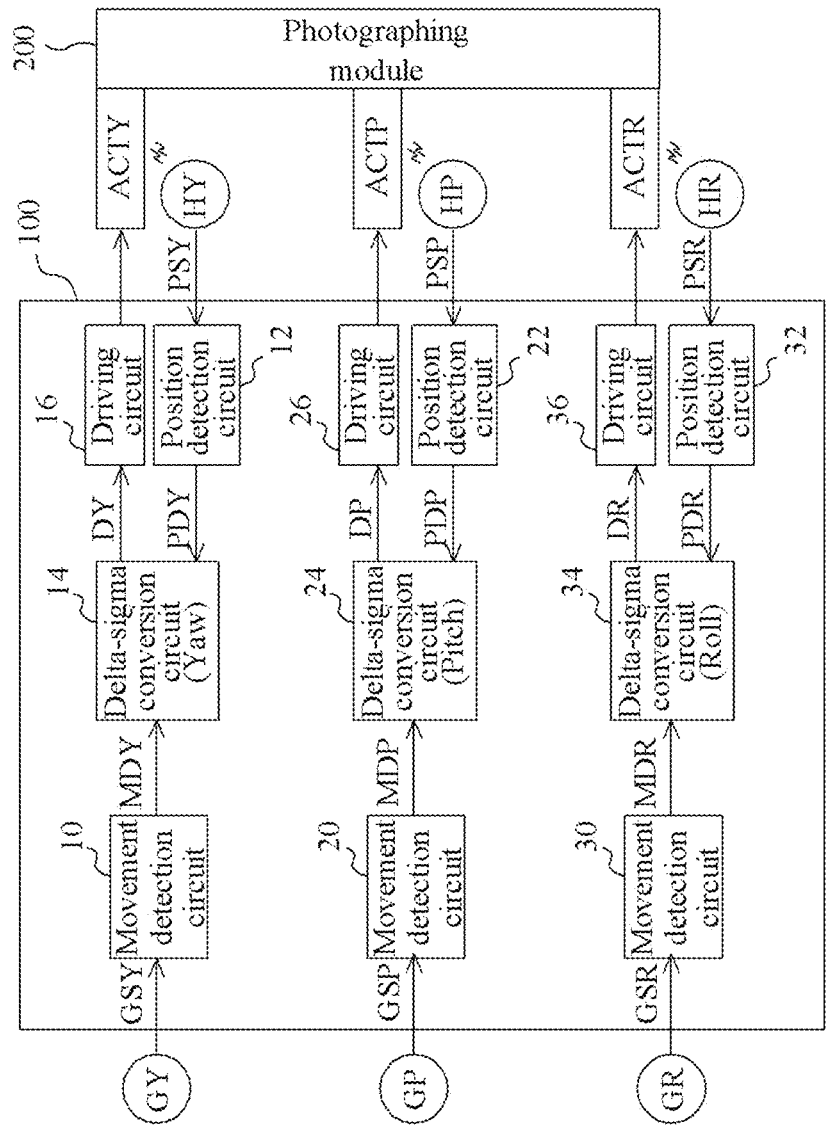
FIG. 1 is a block diagram illustrating a blur compensation circuit of an optical image stabilization device in accordance with an embodiment of the present disclosure.

The OIS device is to reduce the blur of an image photographed by a mobile camera (not illustrated) such as a smart phone, and may be exemplified as illustrated in FIG. 1.

An embodiment of the OIS device of FIG. 1 includes a blur compensation circuit 100 and a photographing module 200.

The blur compensation circuit 100 is to implement an OIS function for compensating for blur, and the photographing module 200 may be understood as a module for photographing configured in the mobile camera.

The photographing module 200 may include a lens (not illustrated) and an image sensor (not illustrated), and an image path is formed between the lens and the image sensor. The image path means a path through which an image of a subject is transferred to the image sensor through the lens.

For the OIS function, the photographing module 200 may further include an OIS lens (not illustrated) between the lens and the image sensor. It may be understood that the OIS lens is driven to adjust the image path.

For example, when a user photographs a subject while holding the mobile camera by the hand, the shake of the user's hand may be transferred to the mobile camera, and the photographing module 200 of the mobile camera may also be transferred with the shake of the hand.

When the shake of the hand is transferred to the photographing module 200, the image path of the photographing module 200 is changed, and the image of the subject on the image sensor is shaken. As a result, the photographing module 200 photographs a blurry image.

Figure 2:
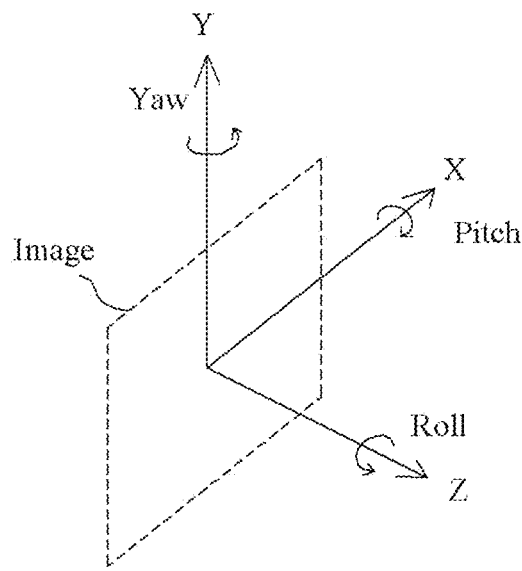
FIG. 2 is a diagram illustrating axes of movement.

The shaking of the photographing module 200 due to the shake of the hand may be expressed as movement. Referring to FIG. 2, with respect to an image, movement may be interpreted as a combination of yaw and pitch or a combination of yaw, pitch and roll.

Pitch refers to rotations around a reference axis parallel to a horizontal movement direction of the image, yaw refers to rotations around a reference axis parallel to a vertical movement direction of the image, and roll refers to rotations around a reference axis parallel to a direction in which the image of the subject is transferred.

In FIG. 2, X is the reference axis of pitch, Y is the reference axis of yaw, and Z is the reference axis of roll.

The blur compensation circuit 100 may be configured to compensate for blur by the movement of the photographing module 200 with respect to the two reference axes of yaw and pitch, or may be configured to compensate for blur by the movement of the photographing module 200 with respect to the three reference axes of yaw, pitch and roll.

The embodiment of the present disclosure will be described on the assumption that the blur compensation circuit 100 is configured to compensate for blur by movement with respect to the three reference axes of yaw, pitch and roll.

Thus, the embodiment of the present disclosure includes gyro sensors GY, GP and GR for sensing the movement of the photographing module 200. For example, the gyro sensors GY, GP and GR may be installed on the photographing module 200, and may be configured to sense the movement of the photographing module 200 by the shake of the hand.

The gyro sensor GY is a sensor for sensing a yaw movement of the photographing module 200, and is configured to output an angular velocity corresponding to the yaw movement as a movement sensing signal GSY. The gyro sensor GP is a sensor for sensing a pitch movement of the photographing module 200, and is configured to output an angular velocity corresponding to the pitch movement as a movement sensing signal GSP. The gyro sensor GR is a sensor for sensing a roll movement of the photographing module 200, and is configured to output an angular velocity corresponding to the roll movement as a movement sensing signal GSR.

In order to compensate for blur by the movement of the photographing module 200, the present disclosure may be configured to drive the photographing module 200 itself, the lens of the photographing module 200, the image sensor of the photographing module 200 or the OIS lens of the photographing module 200. A target to be driven for blur compensation may be selected by a manufacturer, but the embodiment of the present disclosure is described as driving the OIS lens for example. The driving of the OIS lens may be described as driving of the photographing module 200.

A method of driving the OIS lens for blur compensation will be described below in more detail.

The image of the subject is transferred to the image sensor after passing through the lens and the OIS lens in the photographing module 200. When there is hand shake and no blur compensation, the position of the image on the image sensor is changed. In order to compensate for blur, the position of the image on the image sensor should be maintained even when the photographing module 200 is moved by the hand shake.

The OIS lens is configured to change the image path. In order to suppress the position of the image from being changed in correspondence to the movement of the photographing module 200, the OIS lens may be driven to maintain the position of the image on the image sensor by changing the image path in the photographing module 200.

When the OIS lens is driven to compensate for blur, the image of the subject may be maintained at an original position on the image sensor through a changed image path. As a result, blur may be compensated for as the image is suppressed from being shaken on the image sensor.

The present disclosure includes an actuator ACTY for adjusting a yaw position, an actuator ACTP for adjusting a pitch position, and an actuator ACTR for adjusting a roll position. The actuators ACTY, ACTP and ACTR may drive the OIS lens as described above.

The coupling between the actuators ACTY, ACTP and ACTR and the photographing module 200 for position change may be variously implemented, and thus, a detailed example and description thereof will be omitted. The actuators ACTY, ACTP and ACTR and the gyro sensors GY, GP and GR may be configured to match one to one.

In order for blur compensation, the positions of the actuators ACTY, ACTP and ACTR should be sensed. The positions of the actuators ACTY, ACTP and ACTR may be understood as positions with respect to the respective reference axes of the photographing module 200.

The present disclosure includes position sensing elements HY, HP and HR for sensing positions of the actuators ACTY, ACTP and ACTR. The position sensing element HY is an element for sensing the position of the actuator ACTY, and is configured to output a position sensing signal PSY corresponding to a sensing result. The position sensing element HP is an element for sensing the position of the actuator ACTP, and is configured to output a position sensing signal PSP corresponding to a sensing result. The position sensing element HR is an element for sensing the position of the actuator ACTR, and is configured to output a position sensing signal PSR corresponding to a sensing result. Each of the position sensing elements HY, HP and HR may be configured using a Hall sensor.

The blur compensation circuit 100 of FIG. 1 is configured to receive the movement sensing signals GSY, GSP and GSR of the gyro sensors GY, GP and GR and the position sensing signals PSY, PSP and PSR of the position sensing elements HY, HP and HR, and provide drive signals to the actuators ACTY, ACTP and ACTR. The providing of the driving signals to the actuators ACTY, ACTP and ACTR by the blur compensation circuit 100 may be exemplified as controlling currents for driving the actuators ACTY ACTP, and ACTR. This will be described later with reference to FIG. 10.

The blur compensation circuit 100 is configured to generate driving data for compensating for blur, by using the movement of the photographing module 200 by hand shake and the position of an actuator, and compensate for blur by driving the actuator in correspondence to the driving data.

To this end, the blur compensation circuit 100 is configured to include a movement detection circuit, a position detection circuit, a delta-sigma conversion circuit and a driving circuit for each of the reference axes of yaw, pitch and roll set with respect to the image as illustrated in FIG. 2.

In the blur compensation circuit 100 of FIG. 1, a movement detection circuit 10, a position detection circuit 12, a delta-sigma conversion circuit 14 and a driving circuit 16 are components corresponding to the yaw reference axis and are to drive the actuator ACTY. A movement detection circuit 20, a position detection circuit 22, a delta-sigma conversion circuit 24 and a driving circuit 26 are components corresponding to the pitch reference axis and are to drive the actuator ACTP. A movement detection circuit 30, a position detection circuit 32, a delta-sigma conversion circuit 34 and a driving circuit 36 are components corresponding to the roll reference axis and are to drive the actuator ACTR.

The movement detection circuit 10 receives the movement sensing signal GSY of the gyro sensor GY, and outputs a movement detection signal MDY for the yaw reference axis. The movement detection circuit 20 receives the movement sensing signal GSP of the gyro sensor GP, and outputs a movement detection signal MDP for the pitch reference axis. The movement detection circuit 30 receives the movement sensing signal GSR of the gyro sensor GR, and outputs a movement detection signal MDR for the roll reference axis. The movement sensing signals GSY, GSP and GSR may be understood as corresponding to angular velocities for movements of the respective reference axes, and the movement detection signals MDY, MDP and MDR may be understood as corresponding to angles for the movements of the respective reference axes. That is to say, the movement detection circuits 10, 20 and 30 may be understood as being configured to generate the movement detection signals MDY, MDP and MDR corresponding to the angles by integrating the movement sensing signals GSY, GSP and GSR corresponding to the angular velocities.

The position detection circuit 12 receives the position sensing signal PSY of the position sensing element HY for the position of the actuator ACTY on the yaw reference axis, and outputs a position signal PDY with respect to the yaw reference axis. The position detection circuit 22 receives the position sensing signal PSP of the position sensing element HP for the position of the actuator ACTP on the pitch reference axis, and outputs a position signal PDP with respect to the pitch reference axis. The position detection circuit 32 receives the position sensing signal PSR of the position sensing element HR for the position of the actuator ACTR on the roll reference axis, and outputs a position signal PDR with respect to the roll reference axis. The position detection circuits 12, 22 and 32 may be understood as being configured to generate the position signals PDY, PDP and PDR obtained by converting the position sensing signals PSY, PSP and PSR into levels for digital signal processing.

The delta-sigma conversion circuit 14 is configured to generate control data corresponding to the deviation between the movement detection signal MDY and the position signal PDY, perform delta-sigma conversion on the control data, and output driving data DY corresponding to a delta-sigma conversion result. The delta-sigma conversion circuit 24 is configured to generate control data corresponding to the deviation between the movement detection signal MDP and the position signal PDP, perform delta-sigma conversion on the control data, and output driving data DP corresponding to a delta-sigma conversion result. The delta-sigma conversion circuit 34 is configured to generate control data corresponding to the deviation between the movement detection signal MDR and the position signal PDR, perform delta-sigma conversion on the control data, and output driving data DR corresponding to a delta-sigma conversion result.

The driving circuit 16 is configured to control the driving of the actuator ACTY for compensation of blur by the movement of the photographing module 200 with respect to the yaw reference axis, by the driving data DY. The driving circuit 26 is configured to control the driving of the actuator ACTP for compensation of blur by the movement of the photographing module 200 with respect to the pitch reference axis, by the driving data DP. The driving circuit 36 is configured to control the driving of the actuator ACTR for compensation of blur by the movement of the photographing module 200 with respect to the roll reference axis, by the driving data DR.

In the above configuration, operations with respect to the respective reference axes for compensation of blur may be understood as being the same. Thus, the operation of the blur compensation circuit 100 with respect to the yaw reference axis will be described below with reference to FIG. 3.

Figure 3:
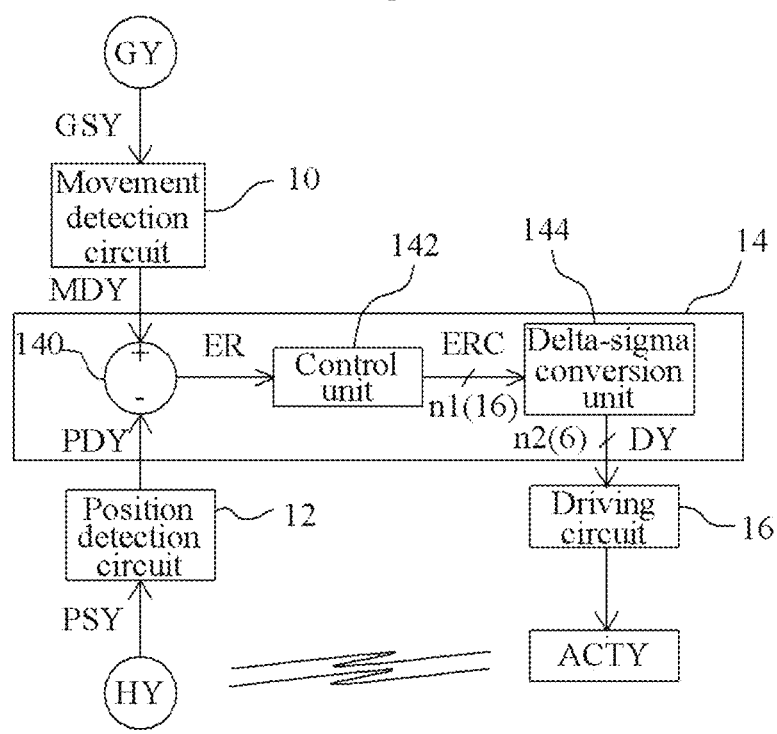
FIG. 3 is a block diagram for explaining the embodiment of the present disclosure on the basis of one axis.

In FIG. 3, the delta-sigma conversion circuit 14 is configured to include a deviation detection unit 140, a control unit 142 and a delta-sigma conversion unit 144.

The deviation detection unit 140 is configured to generate a deviation signal ER corresponding to the deviation between the movement detection signal MDY and the position signal PDY. For example, the deviation detection unit 140 may be configured by using a comparator, and may output the deviation signal ER corresponding to a result of subtracting the position signal PDY of a negative terminal (−) from the movement detection signal MDY of a positive terminal (+).

The control unit 142 may be configured to provide control data ERC which is generated as at least one of proportion, integration and differentiation is applied to the deviation signal ER.

Figure 4:
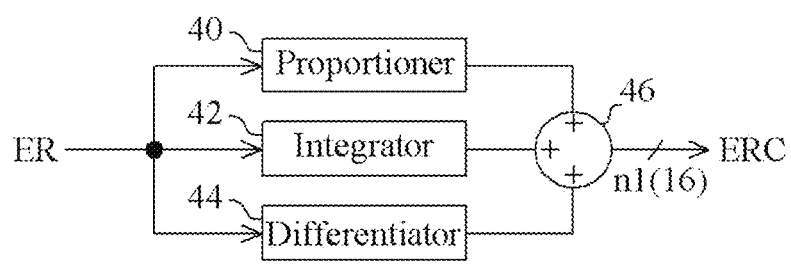
FIG. 4 is a block diagram illustrating a control unit of FIG. 3.

The control unit 142 for this may include a proportioner 40, an integrator 42, a differentiator 44 and a combination circuit 46 as illustrated in FIG. 4.

The control unit 142 may be configured as an embodiment including one or at least two of the proportioner 40, the integrator 42 and the differentiator 44. For example, when one of the proportioner 40, the integrator 42 and the differentiator 44 is included in the control unit 142, the control unit 142 may provide deviation data by one of the proportioner 40, the integrator 42 and the differentiator 44, as the control data ERC. Unlike this, for example, when the proportioner 40, the integrator 42 and the differentiator 44 are included in the control unit 142, the control unit 142 may provide the control data ERC by summing deviation data of the proportioner 40, the integrator 42 and the differentiator 44.

In more detail, as an embodiment of the present disclosure, the control unit 142 will be described as including the proportioner 40, the integrator 42 and the differentiator 44 as illustrated in FIG. 4.

The proportioner 40 is configured to generate first deviation data proportional to a deviation, by using the deviation signal ER. For example, the proportioner 40 may be configured to use a proportional constant Kp. In more detail, the proportioner 40 is configured to convert the deviation between the movement detection signal MDY as a target value and the position signal PDY as a current value, that is, the deviation signal ER, into a value proportional to the proportional constant Kp, and generate and output the first deviation data corresponding to a converted value. By the above configuration, the proportioner 40 may control the compensation of blur due to movement, by gradually adjusting a deviation in proportion to the proportional constant Kp.

The integrator 42 is configured to generate an integral value of the deviation by using the deviation signal ER and generate second deviation data corresponding to the integral value. Since the integrator 42 generates the second deviation data by using the integral value of the deviation, it is possible to control the compensation of blur due to movement, for a small deviation.

The differentiator 44 is configured to generate a differential value for obtaining a rate of change of the deviation by using the deviation signal ER and generate third deviation data corresponding to the differential value. The differentiator 44 may check the rate of change of the deviation, and when the rate of change is large, may output third deviation data to provide the third deviation data for correcting an abrupt change. Therefore, the differentiator 44 may control the compensation of blur due to movement before the deviation becomes large.

In the above description, the integrator 42 and the differentiator 44 may be used together in order to secure the stability of a system.

The combination circuit 46 is configured to sum the first deviation data to the third deviation data and thereby provide the control data ERC.

Each of the proportioner 40, the integrator 42 and the differentiator 44 may include a conversion circuit for converting an output into a digital value, and for example, may output each of the first deviation data to the third deviation data each having n1 bits corresponding to the deviation. n1 may be exemplified as the natural number 16. The combination circuit 46 may be configured to output the control data ERC of n1 bits, that is, 16 bits, by summing the first deviation data to the third deviation data each of n1 bits, that is, 16 bits.

It may be understood that the control data ERC outputted from the control unit 142 includes information corresponding to the magnitude of movement, the direction of movement and the rate of change of movement.

The delta-sigma conversion unit 144 is configured to perform delta-sigma conversion on the control data ERC and output the driving data DY of at least 1 bit. The delta-sigma conversion unit 144 is configured to output the driving data DY of one bit or a plurality of bits to the driving circuit 16, and, in an embodiment, is illustrated as outputting the driving data DY of n2 bits to the driving circuit 16. n2 may be exemplified as the natural number 6.

Figure 5:
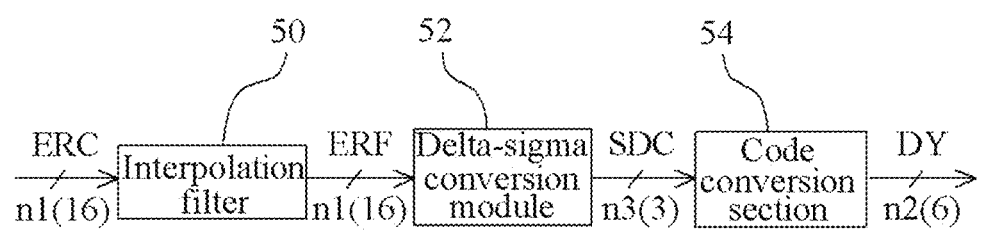
FIG. 5 is a block diagram illustrating a delta-sigma conversion unit of FIG. 3.

For this, the delta-sigma conversion unit 144 may be exemplified as illustrated in FIG. 5.

In FIG. 5, the delta-sigma conversion unit 144 includes an interpolation filter 50, a delta-sigma conversion module 52 and a code conversion section 54.

The interpolation filter 50 is configured to receive an original signal and the control data ERC sampled at a frequency preset by the control unit 142 and output filtering data ERF having a sampling rate higher than the original signal and the control data ERC. The filtering data ERF outputted from the interpolation filter 50 may be outputted at n1 bits, that is, 16 bits.

Figure 6:
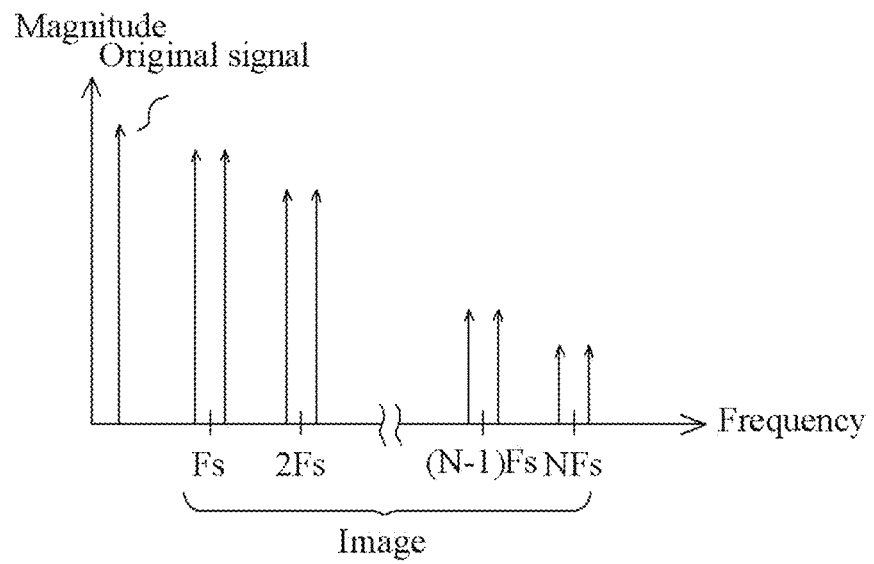
FIG. 6 is a graph showing a frequency spectrum of control data inputted to an interpolation filter of FIG. 5.
Figure 7:
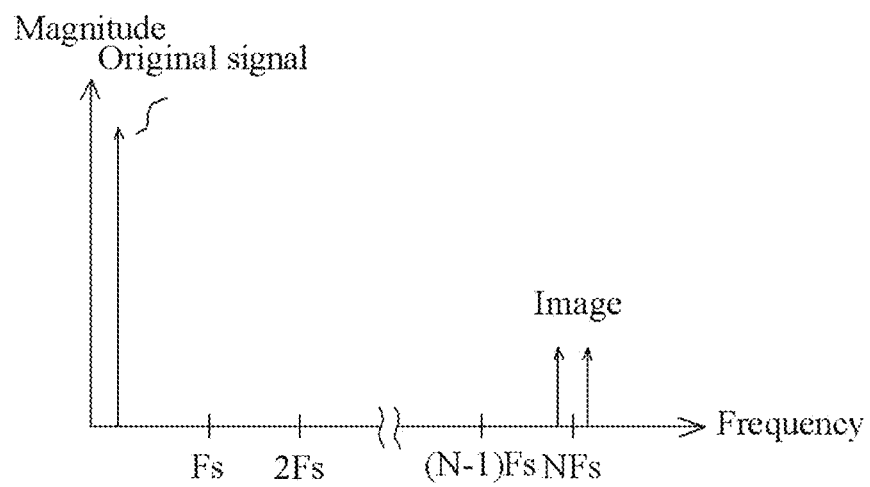
FIG. 7 is a graph showing filtering data outputted from the interpolation filter of FIG. 5.

An input to the interpolation filter 50 may be explained by FIG. 6, and an output from the interpolation filter 50 may be explained by FIG. 7.

The control data ERC inputted to the interpolation filter 50 may be exemplified as being obtained by sampling the original signal at a frequency Fs by the control unit 142. The control data ERC may have a spectrum in which the original signal is copied at each harmonic frequency of the sampling frequency Fs as illustrated in FIG. 6.

The interpolation filter 50 up-samples the control data ERC to have a desired sampling rate, outputs the original signal and the image of a harmonic frequency NFs having a sampling rate increased by the up-sampling, as the filtering data ERF, and filters images distributed at the remaining harmonic frequencies Fs, 2Fs . . . , (N−1)Fs. Up-sampling means increasing the sampling rate of an input signal.

In other words, the interpolation filter 50 may output the filtering data ERF including the frequency NFs having a sampling rate higher than the control data ERC as the input of FIG. 7.

The delta-sigma conversion module 52 is configured to receive the filtering data ERF, perform delta conversion and sigma conversion on the filtering data ERF, and output conversion data SDC corresponding to a conversion result.

The delta-sigma conversion module 52 operates to output the filtering data ERF of n1 bits, that is, 16 bits, as the conversion data SDC of n3 bits. n3 may be exemplified as the natural number 3.

Figure 8:
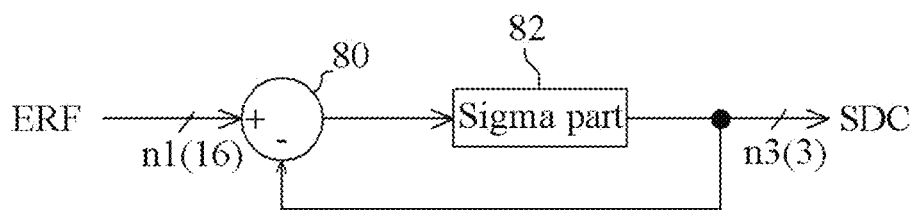
FIG. 8 is a block diagram illustrating a delta-sigma conversion module of FIG. 5.

The delta-sigma conversion module 52 for this may include the configuration of FIG. 8.

Referring to FIG. 8, the delta-sigma conversion module 52 may include a delta part 80 and a sigma part 82.

The delta part 80 is configured to receive the 16-bit filtering data ERF, compare the filtering data ERF and the conversion data SDC which is fed back, and output delta data corresponding to a deviation. For example, the delta part 80 may be configured as a logic circuit which receives the 3-bit conversion data SDC and the 16-bit filtering data ERF and calculates a deviation therebetween, that is, a delta value. The delta part 80 may be configured to output 16-bit delta data.

The sigma part 82 is configured to generate sigma data at a preset sampling rate by integrating the delta data outputted from the delta part 80, and output the conversion data SDC of a preset number of bits by using the sigma data.

The sampling rate may be the same as the sampling rate of the filtering data ERF outputted from the interpolation filter 50.

The sigma part 82 may be configured to output the conversion data SDC of the preset number of bits, for example, 3 bits, generated by selecting some of the bits of the sigma data. The sigma part 82 may be configured to output the conversion data SDC of the preset number of bits, for example, 3 bits, generated by compressing the sigma data.

By the above description, the delta-sigma conversion module 52 may output the conversion data SDC by using the sigma data accumulated in the sigma part 82 in correspondence to the filtering data ERF. As a result, the delta-sigma conversion module 52 may output the 3-bit conversion data SDC in correspondence to the 16-bit filtering data ERF.

The code conversion section 54 is configured to receive the 3-bit conversion data SDC, and output the driving data DY generated by converting the conversion data SDC into the number of bits which may be received by the driving circuit 16.

Figure 9:
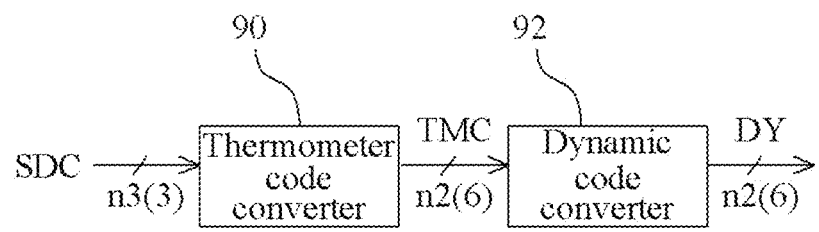
FIG. 9 is a block diagram illustrating a code conversion section of FIG. 5.

The code conversion section 54 for this may include the configuration of FIG. 9.

Referring to FIG. 9, the code conversion section 54 may include a thermometer code converter 90 and a dynamic code converter 92.

The thermometer code converter 90 performs an operation of converting the number of bits of the conversion data SDC to be suitable for the driving circuit 16. To this end, the thermometer code converter 90 may have a preset 6-bit thermometer code TMC corresponding to the value of the 3-bit conversion data SDC.

Therefore, the thermometer code converter 90 may receive the inputted 3-bit conversion data SDC, and may output the 6-bit thermometer code TMC corresponding to the conversion data SDC, thereby converting the 3-bit conversion data SDC into the 6-bit thermometer code TMC.

For example, the thermometer code converter 90 may have the thermometer code TMC of "001111" corresponding to the conversion data SDC of "001." In this case, the thermometer code converter 90 may output the thermometer code TMC of "001111" generated by converting the conversion data SDC of "001."

The conversion of the conversion data SDC into the thermometer code TMC is to prevent distortion when the value of the conversion data SDC does not match the driving circuit 16.

The dynamic code converter 92 is configured to receive the thermometer code TMC, use the thermometer data of a previously inputted thermometer code TMC as a variable index, and output the driving data DY. The driving data DY may have a value which is obtained by applying the variable index to the thermometer data of the currently inputted thermometer code TMC.

The thermometer data may be understood as the value of the thermometer code TMC.

In order for explanation, it is assumed that the maximum value of the thermometer code TMC is limited to "6," the thermometer data of the previously inputted thermometer code TMC is "5," and the thermometer data of the currently inputted thermometer code TMC is "3." The dynamic code converter 92 outputs the driving data DY having a data value of "2" for the currently inputted thermometer code TMC, and uses "2" as a variable index to be applied to a next inputted thermometer code TMC. Since the sum of the thermometer data "3" and the variable index "5" (the thermometer data of the previously inputted thermometer code TMC) is "8," the driving data DY has a value obtained by subtracting the maximum value "6" of the thermometer code TMC from the sum "8," that is, "2," as data.

The application of the dynamic code converter 92 as described above is to prevent linearity distortion that may occur when the driving circuit 16 is driven with a fixed index. By applying the variable index, even when the thermometer code TMC of the same data value is inputted, the driving circuit 16 may be driven to be continuously changed on the basis of a position where a previous movement is controlled, and thereby, the dynamic code converter 92 may secure the linearity of movement control.

As described above, when the 6-bit driving data DY is provided to the driving circuit 16 from the delta-sigma conversion unit 144, the driving circuit 16 may control the driving of the actuator ACTY for the compensation of blur by the movement of the photographing module 200 with respect to the yaw reference axis.

Figure 10:
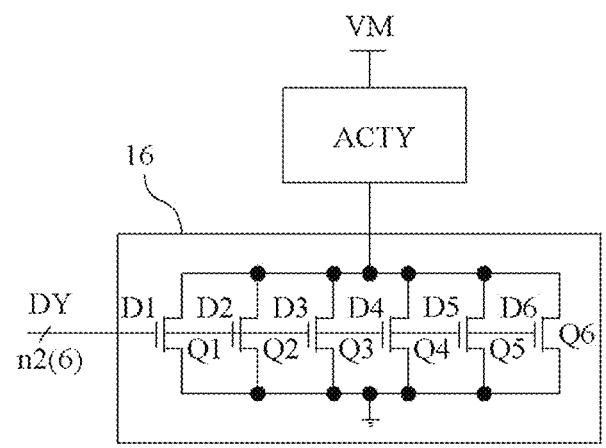
FIG. 10 is a circuit diagram illustrating a driving circuit.

The driving circuit 16 may be exemplified as illustrated in FIG. 10.

The driving circuit 16 may be variously designed for driving the actuator ACTY. For example, when the driving circuit 16 controls the current of the actuator ACTY, the driving circuit 16 may be exemplified as illustrated in FIG. 10.

In FIG. 10, the actuator ACTY is schematically illustrated as being driven by a current by a voltage source VM.

The driving circuit 16 is illustrated as including six transistors Q1 to Q6 which are coupled in parallel to the actuator ACTY through a common node. The bits of the driving data DY are allocated to the gates D1 to D6, respectively, of the six transistors Q1 to Q6. Therefore, each of the transistors Q1 to Q6 may be turned on or off by a high or low level voltage applied to the gate thereof.

Therefore, a current to be supplied to the actuator ACTY may be determined by the turn-on number of the transistors Q1 to Q6, and the driving amount of the actuator ACTY may be controlled in correspondence to the amount of the current.

Through the above description made with reference to FIGS. 3 to 10, in the embodiment of the present disclosure, the detection of the movement of the photographing module 200 with respect to the yaw reference axis, the detection of the position of the actuator ACTY for driving the photographing module 200 with respect to the yaw reference axis, the generation of driving data through delta-sigma conversion corresponding to the movement and position detection, and the driving of the actuator ACTY for compensation of blur with respect to the yaw reference axis by the driving data may be understood.

Compensation of blur with respect to the pitch reference axis and the roll reference axis may also be understood with reference to the above description of FIGS. 3 to 10.

Thus, in the embodiment of the present disclosure, when a user photographs a subject while holding a mobile camera by the hand, the movements of the photographing module 200 with respect to the yaw, pitch and roll reference axes by the shake of the hand and the positions of the actuators ACTY, ACTP and ACTR with respect to the yaw, pitch and roll reference axes may be detected, the driving data DY, DP and DR for compensation of blur with respect to the yaw, pitch and roll reference axes may be outputted from the delta-sigma conversion circuits 14, 24 and 34, and the driving of the actuators ACTY, ACTP and ACTR corresponding to the driving data DY, DP and DR may be performed.

By the above-described blur compensation circuit 100 of the present disclosure, an image path in the photographing module 200 may be changed in real time, and as a result, the image of a subject may be maintained at an original position on an image sensor through the changed image path. That is to say, the present disclosure may compensate for blur by the movement of the photographing module 200 due to the shake of the hand.

As is apparent from the above description, according to the above-described embodiment, the present disclosure may implement a blur compensation circuit of an OIS device by using a simple circuit performing delta-sigma conversion.

Therefore, the blur compensation circuit may be implemented by a simple circuit, and as a result, by compensating for blur, an advantage may be provided in that it is possible to photograph an image of a high resolution.

Also, as the blur compensation circuit is implemented by a simple circuit, an advantage may be provided in that it is possible to reduce a chip area in which the blur compensation circuit is implemented.

Further, according to the embodiments of the present disclosure, advantages may be provided in that, since blur compensation is performed by delta-sigma conversion involving relatively less switching noise, it is possible to improve EMI performance according to reduction in switching noise.

What is claimed is:

1. A blur compensation circuit of an optical image stabilization device, comprising:
   a movement detection circuit configured to provide a movement detection signal corresponding to a movement of a photographing module;
   a position detection circuit configured to provide a position signal of an actuator for driving the photographing module;
   a delta-sigma conversion circuit configured to generate control data corresponding to a deviation between the movement detection signal and the position signal, perform a delta-sigma conversion on the control data, and output driving data corresponding to a result of the delta-sigma conversion; and
   a driving circuit configured to control driving of the actuator by the driving data,
   wherein the delta-sigma conversion unit configured to generate filtering data including an image having a sampling rate higher than the control data, perform the delta-sigma conversion on the filtering data, and output the driving data generated by converting the number of bits of conversion data corresponding to the delta-sigma conversion.

2. The blur compensation circuit according to claim 1, wherein the movement detection circuit receives a movement sensing signal of the photographing module for one reference axis among yaw, pitch and roll reference axes, converts the movement sensing signal into the movement detection signal to be compared with the position signal, and provide the movement detection signal.

3. The blur compensation circuit according to claim 2, wherein the movement detection circuit converts the movement sensing signal corresponding to an angular velocity for the reference axis into the movement detection signal corresponding to an angle.

4. The blur compensation circuit according to claim 1, wherein the delta-sigma conversion circuit comprises:
   a deviation detection unit configured to generate a deviation signal corresponding to the deviation between the movement detection signal and the position signal;
   a control unit configured to provide the control data which is generated by applying at least one of proportion, integration and differentiation to the deviation signal; and
   a delta-sigma conversion unit configured to generate the filtering data including the image having the sampling rate higher than the control data, and output the driving data of at least 1 bit by converting the number of bits of the conversion data corresponding to the delta-sigma conversion on the filtering data.

5. The blur compensation circuit according to claim 4, wherein the control unit comprises one of:
   a proportioner configured to generate first deviation data proportional to the deviation, by using the deviation signal;
   an integrator configured to generate an integral value of the deviation by using the deviation signal, and generate second deviation data corresponding to the integral value; and
   a differentiator configured to generate a differential value for obtaining a rate of change of the deviation by using the deviation signal, and generate third deviation data corresponding to the differential value,
   wherein one of the first deviation data to the third deviation data is provided as the control data.

6. The blur compensation circuit according to claim 4, wherein the control unit comprises:
   a proportioner configured to generate first deviation data proportional to the deviation, by using the deviation signal;
   an integrator configured to generate an integral value of the deviation by using the deviation signal, and generate second deviation data corresponding to the integral value;
   a differentiator configured to generate a differential value for obtaining a rate of change of the deviation by using the deviation signal, and generate third deviation data corresponding to the differential value; and
   a combination circuit configured to provide the control data by summing the first deviation data to the third deviation data.

7. The blur compensation circuit according to claim 4, wherein the delta-sigma conversion unit comprises:
   an interpolation filter configured to receive an original signal and the control data sampled at a preset frequency, and output the filtering data including the image having the sampling rate higher than the original signal and the control data;
   a delta-sigma conversion module configured to receive the filtering data, sequentially perform a delta conversion and a sigma conversion on the filtering data, and output the conversion data corresponding to a conversion result; and
   a code conversion section configured to receive the conversion data, and output the driving data generated by converting the conversion data into the number of bits which may be received by the driving circuit.

8. The blur compensation circuit according to claim 7, wherein the interpolation filter receives the control data, up-samples the control data to have a high sampling rate, outputs the filtering data including the original signal and an image component of a frequency having a desired sampling rate by up-sampling, and removes remaining image components distributed in a frequency spectrum.

9. The blur compensation circuit according to claim 8, wherein the code conversion section comprises:
a thermometer code converter configured to have preset thermometer codes corresponding to values of the conversion data, and output the conversion data by converting the conversion data into a corresponding thermometer code; and
a dynamic code converter configured to receive the thermometer code, use previously inputted thermometer data as a variable index, and output the driving data having a value which is obtained by applying the variable index to currently inputted thermometer data.

10. The blur compensation circuit according to claim 8, wherein
each of the control data and the filtering data has a first number of bits,
the conversion data is configured by at least 1 bit, and has a second number of bits less than the first number of bits, and
the driving data has a third number of bits greater than the second number of bits and less than the first number of bits.

11. The blur compensation circuit according to claim 7, wherein the delta-sigma conversion module comprises:
a delta part configured to receive the filtering data, compare the filtering data and the conversion data which is fed back, and output delta data corresponding to a deviation; and
a sigma part configured to generate sigma data by integrating the delta data, and output the conversion data of a preset number of bits by using the sigma data.

12. The blur compensation circuit according to claim 11, wherein the sigma part outputs the conversion data which is generated by selecting some of the bits of the sigma data.

13. The blur compensation circuit according to claim 11, wherein the sigma part outputs the conversion data which is generated by compressing the sigma data.

14. The blur compensation circuit according to claim 1, wherein the movement detection circuit, the position detection circuit, the delta-sigma conversion circuit and the driving circuit are configured for each of the yaw and pitch reference axes set on the basis of an image captured by the photographing module.

15. The blur compensation circuit according to claim 14, wherein the movement detection circuit, the position detection circuit, the delta-sigma conversion circuit and the driving circuit are additionally configured for the roll reference axis set on the basis of the image captured by the photographing module.

16. The blur compensation circuit according to claim 1, wherein the driving circuit controls driving of the actuator which is configured in correspondence to one of the photographing module, a lens of the photographing module, an image sensor of the photographing module and an OIS lens between the lens and the image sensor.

17. A blur compensation circuit of an optical image stabilization device, comprising:
a delta-sigma conversion circuit configured to output driving data corresponding to a deviation between a movement detection signal corresponding to a movement of a photographing module and a position signal of an actuator which drives the photographing module,
wherein the delta-sigma conversion circuit configured to:
generate control data corresponding to the deviation between the movement detection signal and the position signal,
generate filtering data including an image having a sampling rate higher than the control data,
perform a delta-sigma conversion on the filtering data, and
output the driving data generated by converting a number of bits of conversion data corresponding to a result of the delta-sigma conversion.

18. The blur compensation circuit according to claim 17, wherein the delta-sigma conversion circuit comprises:
a deviation detection unit configured to generate a deviation signal corresponding to the deviation between the movement detection signal and the position signal;
a control unit configured to provide the control data which is generated by applying at least one of proportion, integration and differentiation to the deviation signal; and
a delta-sigma conversion unit configured to generate the filtering data including the image having the sampling rate higher than the control data, perform the delta-sigma conversion on the filtering data, and output the driving data of at least 1 bit by converting the number of bits of the conversion data corresponding to the result of the delta-sigma conversion.

19. The blur compensation circuit according to claim 18, wherein the control unit comprises one of:
a proportioner configured to generate first deviation data proportional to the deviation, by using the deviation signal;
an integrator configured to generate an integral value of the deviation by using the deviation signal, and generate second deviation data corresponding to the integral value; and
a differentiator configured to generate a differential value for obtaining a rate of change of the deviation by using the deviation signal, and generate third deviation data corresponding to the differential value,
wherein one of the first deviation data to the third deviation data is provided as the control data.

20. The blur compensation circuit according to claim 18, wherein the control unit comprises:
a proportioner configured to generate first deviation data proportional to the deviation, by using the deviation signal;
an integrator configured to generate an integral value of the deviation by using the deviation signal, and generate second deviation data corresponding to the integral value;
a differentiator configured to generate a differential value for obtaining a rate of change of the deviation by using the deviation signal, and generate third deviation data corresponding to the differential value; and
a combination circuit configured to provide the control data by summing the first deviation data to the third deviation data.

* * * * *